(12) United States Patent
Bryzek et al.

(10) Patent No.: US 9,006,846 B2
(45) Date of Patent: Apr. 14, 2015

(54) THROUGH SILICON VIA WITH REDUCED SHUNT CAPACITANCE

(75) Inventors: Janusz Bryzek, Oakland, CA (US); John Gardner Bloomsburgh, Oakland, CA (US); Cenk Acar, Newport Coast, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 24 days.

(21) Appl. No.: 13/821,612

(22) PCT Filed: Sep. 20, 2011

(86) PCT No.: PCT/US2011/052417
§ 371 (c)(1),
(2), (4) Date: Jun. 18, 2013

(87) PCT Pub. No.: WO2012/040245
PCT Pub. Date: Mar. 29, 2012

(65) Prior Publication Data
US 2013/0277773 A1 Oct. 24, 2013

Related U.S. Application Data

(60) Provisional application No. 61/384,319, filed on Sep. 20, 2010.

(51) Int. Cl.
*H01L 29/84* (2006.01)
*B81B 3/00* (2006.01)
(Continued)

(52) U.S. Cl.
CPC ............... *B81B 3/0086* (2013.01); *B81B 7/007* (2013.01); *B81B 2201/0235* (2013.01); *B81B 2207/096* (2013.01); *H01G 7/06* (2013.01)

(58) Field of Classification Search
CPC .. H01L 29/84; H01L 2924/1461; H01L 21/76
See application file for complete search history.

(56) References Cited

U.S. PATENT DOCUMENTS

| 4,896,156 A | 1/1990 | Garverick |
| 5,487,305 A | 1/1996 | Ristic et al. |
| 5,491,604 A | 2/1996 | Nguyen et al. |

(Continued)

FOREIGN PATENT DOCUMENTS

| CN | 1389704 A | 1/2003 |
| CN | 1816747 A | 8/2006 |

(Continued)

OTHER PUBLICATIONS

"U.S. Appl. No. 12/849,742, Notice of Allowance mailed Nov. 29, 2013", 7 pgs.

(Continued)

*Primary Examiner* — Kyoung Lee
(74) *Attorney, Agent, or Firm* — Schwegman Lundberg & Woessner, P.A.

(57) ABSTRACT

This document refers to apparatus and methods for a device layer of a microelectromechanical system (MEMS) sensor having vias with reduced shunt capacitance. In an example, a device layer can include a substrate having a pair of trenches separated in a horizontal direction by a portion of the substrate, wherein each trench of the pair of trenches includes first and second vertical layers including dielectric, the first and second vertical layers separated by a third vertical layer including polysilicon.

8 Claims, 5 Drawing Sheets

(51) Int. Cl.
*B81B 7/00* (2006.01)
*H01G 7/06* (2006.01)

(56) References Cited

U.S. PATENT DOCUMENTS

| | | | |
|---|---|---|---|
| 5,600,064 A | 2/1997 | Ward | |
| 5,723,790 A | 3/1998 | Andersson | |
| 5,751,154 A | 5/1998 | Tsugai | |
| 5,760,465 A | 6/1998 | Alcoe et al. | |
| 5,765,046 A | 6/1998 | Watanabe et al. | |
| 6,131,457 A | 10/2000 | Sato | |
| 6,214,644 B1 | 4/2001 | Glenn | |
| 6,301,965 B1 | 10/2001 | Chu et al. | |
| 6,351,996 B1 | 3/2002 | Nasiri et al. | |
| 6,366,468 B1 | 4/2002 | Pan | |
| 6,390,905 B1 | 5/2002 | Korovin et al. | |
| 6,501,282 B1 | 12/2002 | Dummermuth et al. | |
| 6,504,385 B2 | 1/2003 | Hartwell | |
| 6,553,835 B1 | 4/2003 | Hobbs et al. | |
| 6,722,206 B2 | 4/2004 | Takada | |
| 6,725,719 B2 | 4/2004 | Cardarelli | |
| 6,781,231 B2 | 8/2004 | Minervini et al. | |
| 6,848,304 B2 | 2/2005 | Geen | |
| 7,051,590 B1 | 5/2006 | Lemkin et al. | |
| 7,054,778 B2 | 5/2006 | Geiger et al. | |
| 7,093,487 B2 | 8/2006 | Mochida | |
| 7,166,910 B2 | 1/2007 | Minervini et al. | |
| 7,202,552 B2 | 4/2007 | Zhe et al. | |
| 7,210,351 B2 | 5/2007 | Lo et al. | |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie et al. | |
| 7,266,349 B2 | 9/2007 | Kappes | |
| 7,293,460 B2 | 11/2007 | Zarabadi et al. | |
| 7,301,212 B1 | 11/2007 | Mian et al. | |
| 7,305,880 B2 | 12/2007 | Caminada et al. | |
| 7,358,151 B2 | 4/2008 | Araki et al. | |
| 7,436,054 B2 | 10/2008 | Zhe | |
| 7,449,355 B2 | 11/2008 | Lutz et al. | |
| 7,451,647 B2 | 11/2008 | Matsuhisa et al. | |
| 7,454,967 B2 | 11/2008 | Skurnik | |
| 7,518,493 B2 | 4/2009 | Bryzek et al. | |
| 7,539,003 B2 | 5/2009 | Ray | |
| 7,544,531 B1 | 6/2009 | Grosjean | |
| 7,595,648 B2 | 9/2009 | Ungaretti et al. | |
| 7,600,428 B2 | 10/2009 | Robert et al. | |
| 7,616,078 B2 | 11/2009 | Prandi et al. | |
| 7,622,782 B2 | 11/2009 | Chu et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,859,352 B2 | 12/2010 | Sutton | |
| 7,950,281 B2 | 5/2011 | Hammerschmidt | |
| 8,004,354 B1 | 8/2011 | Pu et al. | |
| 8,006,557 B2 | 8/2011 | Yin et al. | |
| 8,037,755 B2 | 10/2011 | Nagata et al. | |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,375,789 B2 | 2/2013 | Prandi et al. | |
| 8,421,168 B2 | 4/2013 | Allen et al. | |
| 8,476,970 B2 | 7/2013 | Mokhtar et al. | |
| 8,508,290 B2 | 8/2013 | Elsayed et al. | |
| 8,710,599 B2 | 4/2014 | Marx et al. | |
| 8,739,626 B2 | 6/2014 | Acar | |
| 8,742,964 B2 | 6/2014 | Kleks et al. | |
| 8,754,694 B2 | 6/2014 | Opris et al. | |
| 8,813,564 B2 | 8/2014 | Acar | |
| 2002/0021059 A1 | 2/2002 | Knowles et al. | |
| 2002/0117728 A1* | 8/2002 | Brosnihhan et al. | 257/446 |
| 2002/0178831 A1 | 12/2002 | Takada | |
| 2002/0189352 A1 | 12/2002 | Reeds, III et al. | |
| 2002/0196445 A1 | 12/2002 | Mcclary et al. | |
| 2003/0038415 A1 | 2/2003 | Anderson et al. | |
| 2003/0061878 A1 | 4/2003 | Pinson | |
| 2003/0200807 A1 | 10/2003 | Hulsing, II | |
| 2003/0222337 A1 | 12/2003 | Stewart | |
| 2004/0119137 A1 | 6/2004 | Leonardi et al. | |
| 2004/0177689 A1 | 9/2004 | Cho et al. | |
| 2004/0211258 A1 | 10/2004 | Geen | |
| 2004/0219340 A1 | 11/2004 | McNeil et al. | |
| 2004/0231420 A1 | 11/2004 | Xie et al. | |
| 2004/0251793 A1 | 12/2004 | Matushisa | |
| 2005/0005698 A1 | 1/2005 | McNeil et al. | |
| 2005/0097957 A1 | 5/2005 | Mcneil et al. | |
| 2005/0139005 A1 | 6/2005 | Geen | |
| 2005/0189635 A1 | 9/2005 | Humpston et al. | |
| 2005/0274181 A1 | 12/2005 | Kutsuna et al. | |
| 2006/0032308 A1 | 2/2006 | Acar et al. | |
| 2006/0034472 A1 | 2/2006 | Bazarjani et al. | |
| 2006/0043608 A1 | 3/2006 | Bernier et al. | |
| 2006/0097331 A1 | 5/2006 | Hattori | |
| 2006/0137457 A1 | 6/2006 | Zdeblick | |
| 2006/0207328 A1 | 9/2006 | Zarabadi et al. | |
| 2006/0213265 A1 | 9/2006 | Weber et al. | |
| 2006/0213266 A1 | 9/2006 | French et al. | |
| 2006/0213268 A1 | 9/2006 | Asami et al. | |
| 2006/0246631 A1 | 11/2006 | Lutz et al. | |
| 2007/0013052 A1 | 1/2007 | Zhe et al. | |
| 2007/0034005 A1 | 2/2007 | Acar et al. | |
| 2007/0040231 A1 | 2/2007 | Harney et al. | |
| 2007/0042606 A1 | 2/2007 | Wang et al. | |
| 2007/0047744 A1 | 3/2007 | Harney et al. | |
| 2007/0071268 A1 | 3/2007 | Harney et al. | |
| 2007/0085544 A1 | 4/2007 | Viswanathan | |
| 2007/0099327 A1 | 5/2007 | Hartzell et al. | |
| 2007/0114643 A1 | 5/2007 | DCamp et al. | |
| 2007/0165888 A1 | 7/2007 | Weigold | |
| 2007/0205492 A1 | 9/2007 | Wang | |
| 2007/0220973 A1 | 9/2007 | Acar | |
| 2007/0222021 A1 | 9/2007 | Yao | |
| 2007/0284682 A1 | 12/2007 | Laming et al. | |
| 2008/0049230 A1 | 2/2008 | Chin et al. | |
| 2008/0081398 A1 | 4/2008 | Lee et al. | |
| 2008/0083958 A1 | 4/2008 | Wei et al. | |
| 2008/0083960 A1 | 4/2008 | Chen et al. | |
| 2008/0092652 A1 | 4/2008 | Acar | |
| 2008/0122439 A1 | 5/2008 | Burdick et al. | |
| 2008/0157238 A1 | 7/2008 | Hsiao | |
| 2008/0157301 A1 | 7/2008 | Ramakrishna et al. | |
| 2008/0169811 A1 | 7/2008 | Viswanathan | |
| 2008/0202237 A1 | 8/2008 | Hammerschmidt | |
| 2008/0245148 A1 | 10/2008 | Fukumoto | |
| 2008/0247585 A1 | 10/2008 | Leidl et al. | |
| 2008/0251866 A1 | 10/2008 | Belt et al. | |
| 2008/0290756 A1 | 11/2008 | Huang | |
| 2008/0302559 A1 | 12/2008 | Leedy | |
| 2008/0314147 A1 | 12/2008 | Nasiri | |
| 2009/0064780 A1 | 3/2009 | Coronato et al. | |
| 2009/0072663 A1 | 3/2009 | Ayazi et al. | |
| 2009/0140606 A1 | 6/2009 | Huang | |
| 2009/0166827 A1 | 7/2009 | Foster et al. | |
| 2009/0175477 A1 | 7/2009 | Suzuki et al. | |
| 2009/0183570 A1 | 7/2009 | Acar et al. | |
| 2009/0194829 A1 | 8/2009 | Chung et al. | |
| 2009/0263937 A1 | 10/2009 | Ramakrishna et al. | |
| 2009/0266163 A1 | 10/2009 | Ohuchi et al. | |
| 2010/0019393 A1 | 1/2010 | Hsieh et al. | |
| 2010/0024548 A1 | 2/2010 | Cardarelli | |
| 2010/0038733 A1 | 2/2010 | Minervini | |
| 2010/0044853 A1 | 2/2010 | Dekker et al. | |
| 2010/0052082 A1 | 3/2010 | Lee | |
| 2010/0058864 A1 | 3/2010 | Hsu et al. | |
| 2010/0072626 A1 | 3/2010 | Theuss et al. | |
| 2010/0089154 A1 | 4/2010 | Ballas et al. | |
| 2010/0122579 A1 | 5/2010 | Hsu et al. | |
| 2010/0155863 A1 | 6/2010 | Weekamp | |
| 2010/0206074 A1 | 8/2010 | Yoshida et al. | |
| 2010/0212425 A1 | 8/2010 | Hsu et al. | |
| 2010/0224004 A1 | 9/2010 | Suminto et al. | |
| 2010/0236327 A1 | 9/2010 | Mao et al. | |
| 2011/0030473 A1 | 2/2011 | Acar | |

(56) References Cited

U.S. PATENT DOCUMENTS

| | | |
|---|---|---|
| 2011/0030474 A1 | 2/2011 | Kuang et al. |
| 2011/0031565 A1* | 2/2011 | Marx et al. .................. 257/417 |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0265564 A1 | 11/2011 | Acar et al. |
| 2011/0285445 A1 | 11/2011 | Huang et al. |
| 2013/0139591 A1 | 6/2013 | Acar |
| 2013/0139592 A1 | 6/2013 | Acar |
| 2013/0192364 A1 | 8/2013 | Acar |
| 2013/0192369 A1 | 8/2013 | Acar et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1 | 10/2013 | Acar et al. |
| 2013/0270660 A1 | 10/2013 | Bryzek et al. |
| 2013/0271228 A1 | 10/2013 | Tao et al. |
| 2013/0277772 A1 | 10/2013 | Bryzek et al. |
| 2013/0298671 A1 | 11/2013 | Acar et al. |
| 2013/0328139 A1 | 12/2013 | Acar |
| 2013/0341737 A1 | 12/2013 | Bryzek et al. |
| 2014/0070339 A1 | 3/2014 | Marx |

FOREIGN PATENT DOCUMENTS

| | | |
|---|---|---|
| CN | 1948906 A | 4/2007 |
| CN | 101038299 A | 9/2007 |
| CN | 101180516 A | 5/2008 |
| CN | 101270988 A | 9/2008 |
| CN | 101426718 A | 5/2009 |
| CN | 101813480 A | 8/2010 |
| CN | 101858928 A | 10/2010 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 103403495 A | 11/2013 |
| CN | 203275441 U | 11/2013 |
| CN | 203275442 U | 11/2013 |
| CN | 103663344 A | 3/2014 |
| CN | 203719664 U | 7/2014 |
| CN | 104094084 A | 10/2014 |
| CN | 104105945 A | 10/2014 |
| DE | 112011103124 T5 | 12/2013 |
| DE | 102013014881 A1 | 3/2014 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2259019 A1 | 12/2010 |
| JP | 09089927 A | 4/1997 |
| JP | 10239347 A | 9/1998 |
| JP | 2005024310 A | 1/2005 |
| JP | 2005114394 A | 4/2005 |
| JP | 2005294462 A | 10/2005 |
| JP | 2007024864 A | 2/2007 |
| JP | 2008294455 A | 12/2008 |
| JP | 2009075097 A | 4/2009 |
| JP | 2009186213 A | 8/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 1020130116189 A | 10/2013 |
| KR | 1020130116212 A | 10/2013 |
| KR | 101332701 B1 | 11/2013 |
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO-0175455 A2 | 10/2001 |
| WO | WO-2008059757 A1 | 5/2008 |
| WO | WO-2008087578 A2 | 7/2008 |
| WO | WO-2009050578 A2 | 4/2009 |
| WO | WO-2009156485 A1 | 12/2009 |
| WO | WO-2011016859 A2 | 2/2011 |
| WO | WO-2011016859 A3 | 2/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

"U.S. Appl. No. 12/849,787, Notice of Allowance mailed Dec. 11, 2013", 9 pgs.

"U.S. Appl. No. 13/362,955, Response filed Feb. 17, 2014 to Restriction Requirement mailed Dec. 17, 2013", 9 pgs.

"U.S. Appl. No. 13/362,955, Restriction Requirement mailed Dec. 17, 2013", 6 pgs.

"U.S. Appl. No. 13/363,537, Non Final Office Action mailed Feb. 6, 2014", 10 pgs.

"U.S. Appl. No. 13/742,942, Notice of Allowance mailed Jan. 28, 2014", 9 pgs.

"U.S. Appl. No. 13/746,016, Notice of Allowance mailed Jan. 17, 2014", 10 pgs.

(56) References Cited

OTHER PUBLICATIONS

"U.S. Appl. No. 13/755,841, Restriction Requirement mailed Feb. 21, 2014", 6 pgs.
"Chinese Application Serial No. 201180053926.1, Office Action mailed Jan. 13, 2014", 7 pgs.
"Chinese Application Serial No. 201180054796.3, Office Action mailed Jan. 16, 2014", 8 pgs.
"Chinese Application Serial No. 201180055029.4, Office Action mailed Jan. 13, 2014", 7 pgs.
"Chinese Application Serial No. 201320172366.8, Office Action mailed Jan. 30, 2014", 3 pgs.
"Chinese Application Serial No. 201320172366.8, Office Action mailed Oct. 25, 2013", 8 pgs.
"Chinese Application Serial No. 201320172366.8, Response filed Dec. 24, 2013 to Office Action mailed Oct. 25, 2013", 11 pgs.
"Chinese Application Serial No. 201320565239.4, Office Action mailed Jan. 16, 2014", w/English Translation, 3 pgs.
"European Application Serial No. 10806751.3, Extended European Search Report mailed Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action mailed Dec. 27, 2013", 8 pgs.
"Korean Application Serial No. 10-2013-7009775, Response filed Oct. 29, 2013 to Office Action mailed Sep. 17, 2013", w/English Claims, 23 pgs.
"Korean Application Serial No. 10-2013-7009777, Office Action mailed Jan. 27, 2014", 5 pgs.
"Korean Application Serial No. 10-2013-7009777, Response filed Nov. 5, 2013 to Office Action mailed Sep. 17, 2013", 11 pgs.
"Korean Application Serial No. 10-2013-7009788, Office Action mailed Dec. 27, 2013", w/English Translation, 10 pgs.
"Korean Application Serial No. 10-2013-7009788, Response filed Oct. 29, 2013 to Office Action mailed Aug. 29, 2013", w/English Claims, 22 pgs.
"U.S. Appl. No. 12/849,787, Non Final Office Action mailed May 28, 2013", 18 pgs.
"U.S. Appl. No. 12/947,543, Notice of Allowance mailed Dec. 17, 2012", 11 pgs.
"U.S. Appl. No. 13/821,598, Preliminary Amendment filed Mar. 8, 2013", 7 pgs.
"U.S. Appl. No. 13/821,609, Preliminary Amendment filed Mar. 8, 2013", 3 pgs.
"U.S. Appl. No. 13/821,619, Preliminary Amendment filed Mar. 8, 2013", 3 pgs.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"Epcos MEMS Microphone With TSV", 1 pg.
"International Application Serial No. PCT/US2011/051994, International Preliminary Report on Patentability mailed Mar. 28, 2013", 8 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb. 29, 2012", 3 pgs.
"International Application Serial No. PCT/US2011/052340, Written Opinion mailed Feb. 29, 2012", 3 pgs.
"International Application Serial No. PCT/US2011/052369, International Preliminary Report on Patentability mailed Apr. 4, 2013", 5 pgs.
"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
"U.S. Appl. No. 12/849,742, Supplemental Notice of Allowability mailed Mar. 17, 2014", 3 pgs.
"U.S. Appl. No. 12/849,742, Supplemental Notice of Allowability mailed May 5, 2014", 2 pgs.
"U.S. Appl. No. 12/849,787, Supplemental Notice of Allowability mailed Mar. 21, 2014", 3 pgs.
"U.S. Appl. No. 13/362,955, Non Final Office Action mailed Apr. 15, 2014", 9 pgs.
"U.S. Appl. No. 13/363,537, Response filed Jun. 6, 2014 to Non Final Office Action mailed Feb. 6, 2014", 11 pgs.
"U.S. Appl. No. 13/742,942, Supplemental Notice of Allowability mailed Apr. 10, 2014", 2 pgs.
"U.S. Appl. No. 13/755,841, Notice of Allowance mailed May 7, 2014", 8 pgs.
"U.S. Appl. No. 13/755,841, Preliminary Amendment filed Oct. 10, 2013", 10 pgs.
"U.S. Appl. No. 13/755,841, Response filed Apr. 21, 2014 to Restriction Requirement mailed Feb. 21, 2014", 7 pgs.
"U.S. Appl. No. 13/821,589, Restriction Requirement mailed Apr. 11, 2014", 10 pgs.
"Chinese Application Serial No. 2010800423190, Office Action mailed Mar. 26, 2014", 10 pgs.
"Chinese Application Serial No. 201180053926.1, Response filed Apr. 29, 2014 to Office Action mailed Jan. 13, 2014", w/English Claims, 10 pgs.
"Chinese Application Serial No. 201180055029.4, Response filed May 27, 2014 to Office Action mailed Jan. 13, 2014", w/English Claims, 29 pgs.
"Chinese Application Serial No. 201180055309.5, Office Action mailed Mar. 31, 2014", w/English Claims, 7 pgs.
"Chinese Application Serial No. 201320172366.8, Response filed Mar. 18, 2014 to Office Action mailed Jan. 30, 2014", w/English Claims, 20 pgs.
"Chinese Application Serial No. 201320565239.4, Response filed Mar. 31, 2014 to Office Action mailed Jan. 16, 2014", w/English Claims, 38 pgs.
"European Application Serial No. 118260070.2, Office Action mailed Mar. 12, 2014", 1 pg.
"European Application Serial No. 11826070.2, Extended European Search Report mailed Feb. 21, 2014", 5 pgs.
"European Application Serial No. 11826071.0, Extended European Search Report mailed Feb. 20, 2014", 6 pgs.
"European Application Serial No. 11826071.0, Office Action mailed Mar. 12, 2014", 1 pg.
"European Application Serial No. 13001692.6, Response filed Apr. 1, 2014 to Extended European Search Report mailed Jul. 24, 2013", 19 pgs.

(56) References Cited

OTHER PUBLICATIONS

"European Application Serial No. 13001721.3, Response filed Apr. 7, 2014 to Extended European Search Report mailed Jul. 18, 2013", 25 pgs.
"Korean Application Serial No. 10-2013-7009777, Response filed Apr. 28, 2014", w/English Claims, 19 pgs.
"U.S. Appl. No. 12/849,742, Response filed Sep. 30, 2013 to Non-Final Office Action mailed Mar. 28, 2013", 12 pgs.
"U.S. Appl. No. 12/849,787, Response filed Oct. 28, 2013 to Non Final Office Action mailed May 28, 2013", 12 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.

"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf?...>, (Jan. 1, 2004), 123 pgs.
"U.S. Appl. No. 12/849,742, Non Final Office Action mailed Mar. 28, 2013", 9 pgs.
"U.S. Appl. No. 12/849,742, Non Final Office Action mailed Aug. 23, 2012", 9 pgs.
"U.S. Appl. No. 12/849,742, Response filed Jan. 23, 2012 to Non Final Office Action mailed Aug. 23, 2012", 10 pgs.
"U.S. Appl. No. 12/849,787, Response filed Feb. 4, 2013 to Restriction Requirement mailed Oct. 4, 2012", 7 pgs.
"U.S. Appl. No. 12/849,787, Restriction Requirement mailed Oct. 4, 2012", 5 pgs.
"U.S. Appl. No. 13/813,443, Preliminary Amendment mailed Jan. 31, 2013", 3 pgs.
"U.S. Appl. No. 13/821,586, Preliminary Amendment mailed Mar. 8, 2013", 6 pgs.
"U.S. Appl. No. 13/821,589, Preliminary Amendment mailed Mar. 8, 2013", 6 pgs.
"U.S. Appl. No. 13/821,793, Preliminary Amendment mailed Mar. 8, 2013", 3 pgs.
"U.S. Appl. No. 13/821,842, Preliminary Amendment mailed Mar. 8, 2013", 3 pgs.
"U.S. Appl. No. 13/821,853, Preliminary Amendment mailed Mar. 8, 2013", 3 pgs.
"Application Serial No. PCT/US2011/051994, International Republished Application mailed Jun. 7, 2012", 1 pg.
"Application Serial No. PCT/US2011/052006, International Republished Application mailed Jun. 7, 2012", 1 pg.
"Application Serial No. PCT/US2011/052417, International Republished Application mailed Jun. 7, 2012", 1 pg.
"International Application Serial No. PCT/US2010/002166, International Preliminary Report on Patentability mailed Feb. 16, 2012", 6 pgs.
"International Application Serial No. PCT/US2010/002166, International Search Report mailed Feb. 28, 2011", 3 pgs.
"International Application Serial No. PCT/US2010/002166, Written Opinion mailed Feb. 28, 2011", 4 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.

(56) References Cited

OTHER PUBLICATIONS

"International Application Serial No. PCT/US2011/052006, International Preliminary Report on Patentability mailed Mar. 28, 2013", 7 pgs.
"International Application Serial No. PCT/US2011/052006, Search Report mailed Apr. 16, 2012", 3 pgs.
"International Application Serial No. PCT/US2011/052006, Written Opinion mailed Apr. 16, 2012", 5 pgs.
"International Application Serial No. PCT/US2011/052059, International Preliminary Report on Patentability mailed Jan. 22, 2013", 14 pgs.
"International Application Serial No. PCT/US2011/052059, Search Report mailed Apr. 20, 2012", 4 pgs.
"International Application Serial No. PCT/US2011/052059, Written Opinion mailed Apr. 20, 2012", 7 pgs.
"International Application Serial No. PCT/US2011/052060, International Preliminary Report on Patentability mailed Jan. 22, 2013", 12 pgs.
"International Application Serial No. PCT/US2011/052060, International Search Report Apr. 20, 2012", 3 pgs.
"International Application Serial No. PCT/US2011/052060, Written Opinion mailed Apr. 20, 2012", 7 pgs.
"International Application Serial No. PCT/US2011/052061, International Preliminary Report on Patentability mailed Mar. 28, 2013", 6 pgs.
"International Application Serial No. PCT/US2011/052061, International Search Report mailed Apr. 10, 2012", 3 pgs.
"International Application Serial No. PCT/US2011/052061, Written Opinion mailed Apr. 10, 2012", 4 pgs.
"International Application Serial No. PCT/US2011/052064, International Preliminary Report on Patentability mailed Mar. 28, 2013", 5 pgs.
"International Application Serial No. PCT/US2011/052064, Search Report mailed Feb. 29, 2012", 3 pgs.
"International Application Serial No. PCT/US2011/052064, Written Opinion mailed Feb. 29, 2012", 3 pgs.
"International Application Serial No. PCT/US2011/052065, International Preliminary Report on Patentability mailed Mar. 28, 2013", 7 pgs.
"International Application Serial No. PCT/US2011/052065, International Search Report mailed Apr. 10, 2012", 3 pgs.
"International Application Serial No. PCT/US2011/052065, Written Opinion mailed Apr. 10, 2012", 5 pgs.
"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.

"U.S. Appl. No. 13/362,955, Final Office Action mailed Nov. 19, 2014", 5 pgs.
"U.S. Appl. No. 13/363,537, Notice of Allowance mailed Nov. 7, 2014", 5 pgs.
"U.S. Appl. No. 13/821,586, Response filed Nov. 24, 2014 to Restriction Requirement mailed Sep. 22, 2014", 6 pgs.
"U.S. Appl. No. 13/821,589, Response filed Nov. 10, 2014 to Non Final Office Action mailed Jul. 9, 2014", 15 pgs.
"U.S. Appl. No. 13/821,598, Non Final Office Action mailed Nov. 20, 2014", 9 pgs.
"Chinese Application Serial No. 201180055029.4, Response filed Nov. 14, 2014 to Office Action mailed Jul. 2, 2014", w/English Claims, 23 pgs.
"European Application Serial No. 11827384.6, Extended European Search Report mailed Nov. 12, 2014", 6 pgs.
"U.S. Appl. No. 13/362,955, Response filed Aug. 15, 2014 to Non Final Office Action mailed May 15, 2014", 13 pgs.
"U.S. Appl. No. 13/363,537, Examiner Interview Summary mailed Sep. 29, 2014", 3 pgs.
"U.S. Appl. No. 13/363,537, Final Office Action mailed Jun. 27, 2014", 8 pgs.
"U.S. Appl. No. 13/363,537, Response filed Sep. 29, 2014 to Final Office Action mailed Jun. 27, 2014", 9 pgs.
"U.S. Appl. No. 13/742,942, Notice of Allowance mailed Jan. 28, 2014", 8 pgs.
"U.S. Appl. No. 13/755,841, Supplemental Notice of Allowability Jun. 27, 2014", 2 pgs.
"U.S. Appl. No. 13/821,586, Restriction Requirement mailed Sep. 22, 2014", 4 pgs.
"U.S. Appl. No. 13/821,589, Non Final Office Action mailed Jul. 9, 2014", 10 pgs.
"U.S. Appl. No. 13/821,589, Response to Restriction Requirement mailed Apr. 11, 2014", 6 pgs.
"U.S. Appl. No. 13/821,598, Response filed Oct. 15, 2014 to Restriction Requirement mailed Aug. 15, 2014", 8 pgs.
"U.S. Appl. No. 13/821,598, Restriction Requirement mailed Aug. 15, 2014", 11 pgs.
"U.S. Appl. No. 13/821,853, Non Final Office Action mailed Jul. 30, 2014", 10 pgs.
"U.S. Appl. No. 13/860,761, Non Final Office Action mailed Aug. 19, 2014", 13 pgs.
"Chinese Application Serial No. 2010800423190, Response filed Aug. 11, 2014 to Office Action mailed Mar. 26, 2014", w/English Claims, 11 pgs.
"Chinese Application Serial No. 201180054796.3, Office Action mailed Sep. 4, 2014", w/English Claims, 11 pgs.
"Chinese Application Serial No. 201180054796.3, Response filed Jun. 30, 2014 to Office Action mailed Jan. 16, 2014", w/English Claims, 3 pgs.
"Chinese Application Serial No. 201180055029.4, Office Action mailed Jul. 2, 2014", w/English Translation, 5 pgs.
"Chinese Application Serial No. 201180055309.5, Response filed Aug. 13, 2014 to Office Action mailed Mar. 31, 2014", w/English Claims, 27 pgs.
"Chinese Application Serial No. 201310118845.6, Office Action mailed Sep. 9, 2014", 8 pgs.
"Chinese Application Serial No. 201310119472.4, Office Action mailed Sep. 9, 2014", w/English Translation, 11 pgs.
"Chinese Application Serial No. 201380007588.7, Notification to Make Rectification mailed Aug. 18, 2014", w/English Translation, 2 pgs.
"Chinese Application Serial No. 201380007615.0, Notification to Make Rectification mailed Aug. 18, 2014", w/English Translation, 2 pgs.
"European Application Serial No. 10806751.3, Response filed Jul. 24, 2014 to Office Action mailed Jan. 24, 2014", 26 pgs.
"European Application Serial No. 11826043.9, Office Action mailed May 6, 2013", 2 pgs.
"European Application Serial No. 11826043.9, Response filed Nov. 4, 2013 to Office Action mailed May 6, 2013", 6 pgs.
"European Application Serial No. 11826067.8, Extended European Search Report mailed Oct. 6, 2014", 10 pgs.

(56) References Cited

OTHER PUBLICATIONS

"European Application Serial No. 11826068.6, Extended European Search Report mailed Jul. 16, 2014", 10 pgs.

"European Application Serial No. 11826070.2, Response filed Sep. 19, 2014 to Office Action mailed Mar. 12, 2014", 11 pgs.

"European Application Serial No. 11826071.0, Response filed Sep. 19, 2014 to Office Action mailed Mar. 12, 2014", 20 pgs.

"European Application Serial No. 11827347.3, Office Action mailed May 2, 2013", 6 pgs.

"European Application Serial No. 11827347.3, Response filed Oct. 30, 2013 to Office Action mailed May 2, 2013", 9 pgs.

"European Application Serial No. 13001695.9, European Search Report mailed Oct. 5, 2014", 6 pgs.

"European Application Serial No. 13001719.7, Extended European Search Report mailed Jun. 24, 2014", 10 pgs.

"International Application Serial No. PCT/US2013/021411, International Preliminary Report on Patentability mailed Aug. 14, 2014", 7 pgs.

"International Application Serial No. PCT/US2013/023877, International Preliminary Report on Patentability mailed Aug. 14, 2014", 7 pgs.

"International Application Serial No. PCT/US2013/024138, International Preliminary Report on Patentability mailed Aug. 14, 2014", 6 pgs.

"International Application Serial No. PCT/US2013/024149, International Preliminary Report on Patentability mailed Aug. 14, 2014", 6 pgs.

Dunn, C, et al., "Efficient linearisation of sigma-delta modulators using single-bit dither", Electronics Letters 31(12), (Jun. 1995), 941-942.

Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.

Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.

Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.

* cited by examiner

THROUGH SILICON VIA WITH REDUCED SHUNT CAPACITANCE

CLAIM OF PRIORITY

This application is a U.S. National Stage Filing under 35 U.S.C. 371 from International Patent Application Serial No. PCT/US2011/052417 filed on Sep. 20, 2011, and published on Mar. 29, 2012 as WO 2012/040245 A2 and republished on Jun. 7, 2012 as WO 2012/040245 A3, which claims the benefit of priority under 35 U.S.C. §119(e) to Bryzek, et al., U.S. Provisional Patent Application Ser. No. 61/384,319, entitled "TSV WITH REDUCED SHUNT CAPACITANCE", filed Sep. 20, 2010, each of which are hereby incorporated by reference herein in its entirety.

BACKGROUND

Microelectromechanical system (MEMS) chips can include multiple layers including a via layer. The via layer can include dielectric trenches used to form electrodes for sensing characteristics of the MEMS device within the MEMS chip. Such trenches are referred to in U.S. Pat. No. 7,539,003. The dielectric trenches can have significant shunt capacitance that can degrade performance of the MEMS device, such as MEMS devices used for capacitive sensing or radio frequency (RF) applications.

OVERVIEW

In certain examples, a microelectromechanical system (MEMS) sensor can include vias with reduced shunt capacitance. In an example, a device layer can include a substrate having a pair of trenches separated in a horizontal direction by a portion of the substrate, wherein each trench of the pair of trenches includes first and second vertical layers including a dielectric, the first and second vertical layers separated by a third vertical layer including polysilicon.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The inventors have discovered structures and methods for forming electrodes in a via layer of a MEMS device that significantly reduces shunt capacitance associated with existing designs. In certain examples, a layer of an integrated MEMS device can include through silicon via (TSV) structures with multiple high-resistivity, poly filled layers interleaved with multiple dielectic layers. The TSV structures can couple the high resistivity poly in series with the dielectric, thus, reducing the capacitive shunting effect on a sense capacitor of the MEMS device. In certain examples, an operating frequency of the the electronics associated with the MEMS device can be selected such that the impedance of the sense capacitor is larger than the impedance of the shunt capacitance, thus, reducing the effect of the shunt capacitance. In an example, a dielectric trench including low-K dielectric or a combination of low-k dielectric and other materials, such as thermal oxides, doped oxides, or other dielectric materials can lower shunt capacitance, for example, where the low-k dielectric includes a dielectric constant that is lower than oxides used in the trench. In an example, the low-K dielectric can have a dielectric constant that is about half of the dielectric constant of oxide.

In certain examples, a trench can be partially filled with poly and under negative pressure, e.g., vacuum. The dielectric constant of the area of the trench under vacuum can be four times lower than oxide, thus reducing the shunt capacitance with respect to an oxide filled trench.

Figure 1:
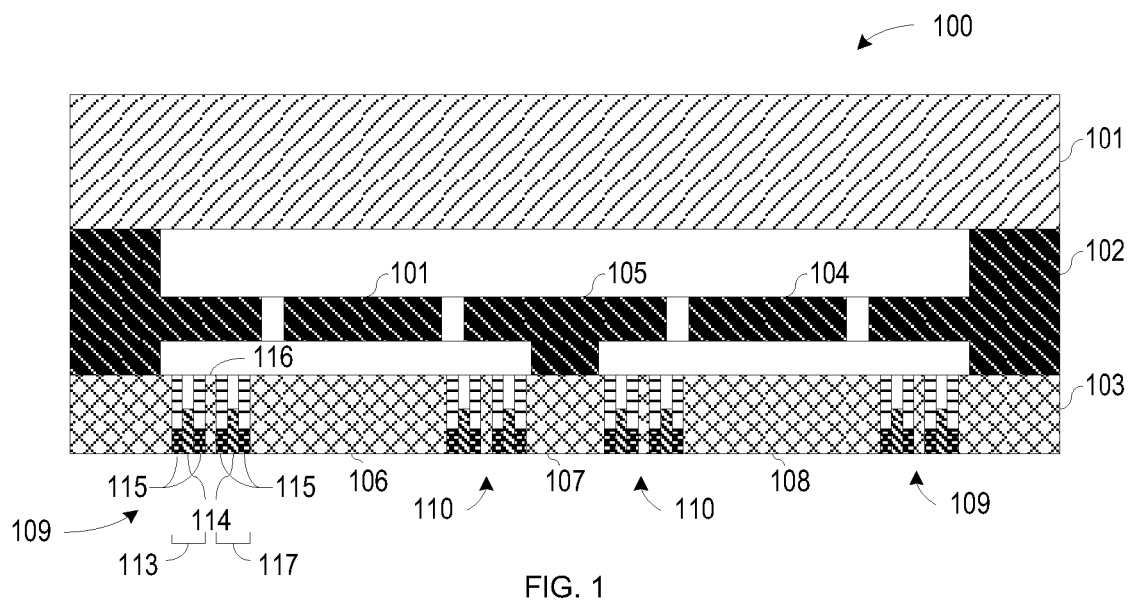
FIG. 1 illustrates generally a cross-section of an example MEMS device.

FIG. 1 illustrates generally a cross-section of an example MEMS device 100. In certain examples, the MENS device 100 can include three layers, a cap layer 101, a device layer 102, and a via layer 103. The device layer 102 can include moveable portions 104 supported by an anchor 105. In certain examples, the moveable portions 104 of the MEMS device 100 can be etched from a silicon wafer. The etched device layer 102 can include structures that allow sensing of in-plane and out-of plane movement of the moveable portions 104. In certain examples, the moveable portions 104 can be driven to oscillate at a particular frequency to allow sensing of angular acceleration of the MEMS device 100.

The cap layer 101 can provide at least a portion of an environmental enclosure of the moveable portions 104 of the device layer 102. In certain examples, the cap layer 101 can include a recess (not shown) to accommodate the movement of the moveable portions 104 of the device layer 102. In an example, the cap layer 101 can restrict the movement of the moveable portions 104 of the device layer 102, such as when the MEMS device 100 is mechanically shocked. In certain embodiments, the cap layer 101 is bonded to the device layer 102 such that a vacuum can be maintained about the moveable portions 104 of the device layer 102.

The via layer 103 can also provide a portion of an environmental enclosure of the moveable portions 104 of the device layer 102. In certain examples, the via layer 103 can include electrodes 106, 107, 108 for sensing or driving the moveable portions 104 of the device layer 102. In an example, one or more of the device layer electrodes, for example a drive electrode 107 can provide a drive signal to the device layer 102. In an example, one or more sense electrodes 106, 108 of the via layer 103 can provide sensing information indicative of movement of the moveable portions 104 of the device layer 102. In certain example, the sensing information can include changes in sense capacitance related to the movement of the moveable portions 104 of the device layer 102. In an example, trenches 109, 110 within the via layer 103 can provide a degree of electrical isolation of the sense electrodes.

Figure 2:
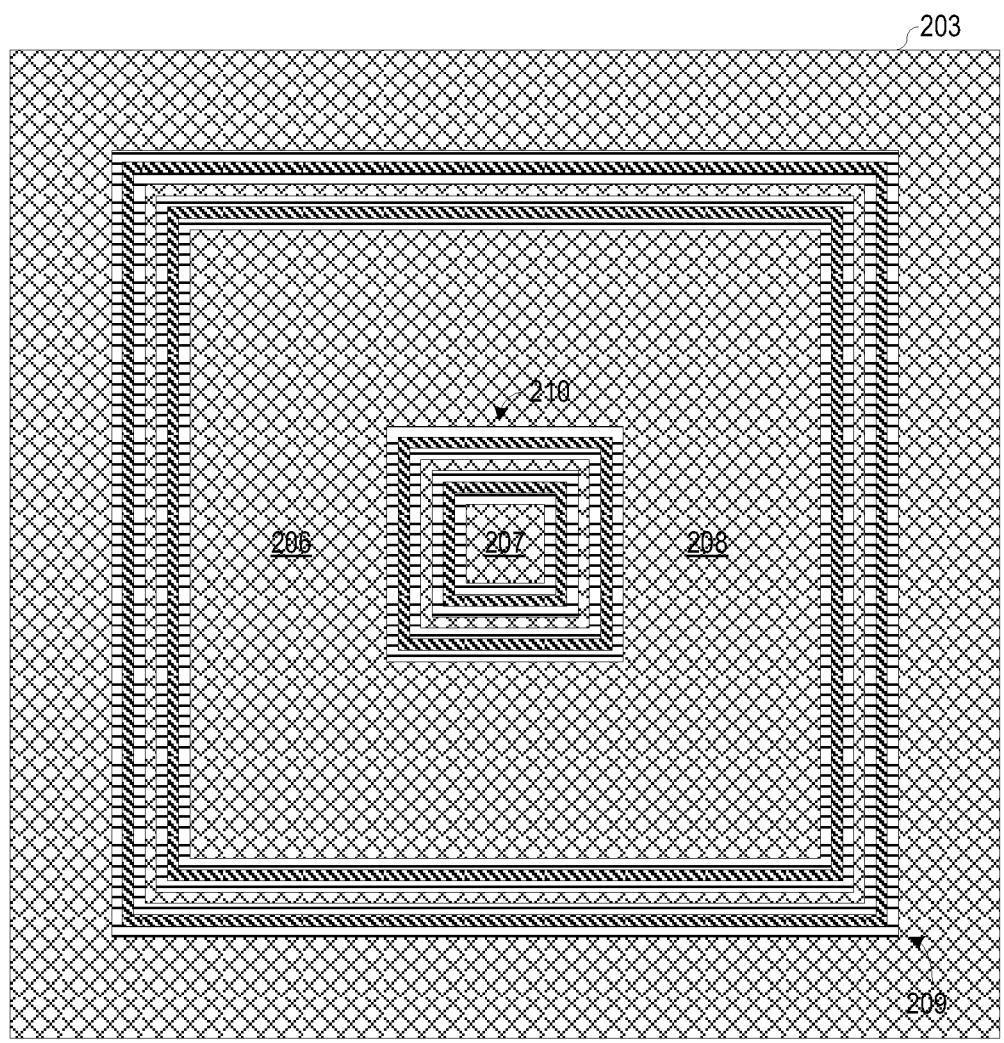
FIG. 2 illustrates generally a layout view of an example via layer.

FIG. 2 illustrates generally a layout view of an example via layer 203 including trench, or via, structures that can provide reduced shunt capacitance compared to existing structures. The layout of the via layer 203 includes areas for multiple electrodes. In an example, the layout of the via layer 203 can include a drive electrode 207 near the center and sense electrodes 206, 208 surrounding the drive electrode 207. In certain examples, the sense electrodes can be isolated from the drive electrode 207, as well as, an outer area of silicon of the via layer 203, by dielectric trenches, or via structures 209, 210. Referencing FIG. 1, but extendable to the example of FIG. 2, in an example, the dielectric trenches 109, 110 can include a first trench region 113 including a vertical layer of polysilicon 114 positioned between vertical layers of dielectric 115. In an example, a second trench region 117, separated from the first trench region by a vertical layer of monocrystalline silicon 116, can include a second vertical layer of polysilicon 118 positioned between layers of dielectric 115. With regard to FIG. 1, a drive signal can be applied to the moveable portions 104 of the device layer 102 through a section of the via layer 103, e.g., anchor electrode 107, electrically isolated from a sense electrode 106, 108 by a quadruple dielectric trench 110. In an example, the other side of the sense electrode 106, 108, opposite the drive electrode 107, can be isolated from a grounded part of the via layer 103 through another quadruple dielectric trench 109.

In an example, not shown, an isolating trench can surround the sensing electrode, and a separate trench can be formed around the anchor electrode for connecting drive voltage. As the drive voltage is not sensitive to shunt capacitance, a simple single trench can be used for isolating the anchor electrode.

A sensor of the MEMS device can include a sense capacitance coupled to the sense electrode 106, 108. Movement of the moveable portions 104 of the device layer 102 can change the sense capacitance. The sense electrode 106, 108, including low resistance monocrystalline in certain examples, can be used to measure the changes of the sense capacitance.

Figure 3A:
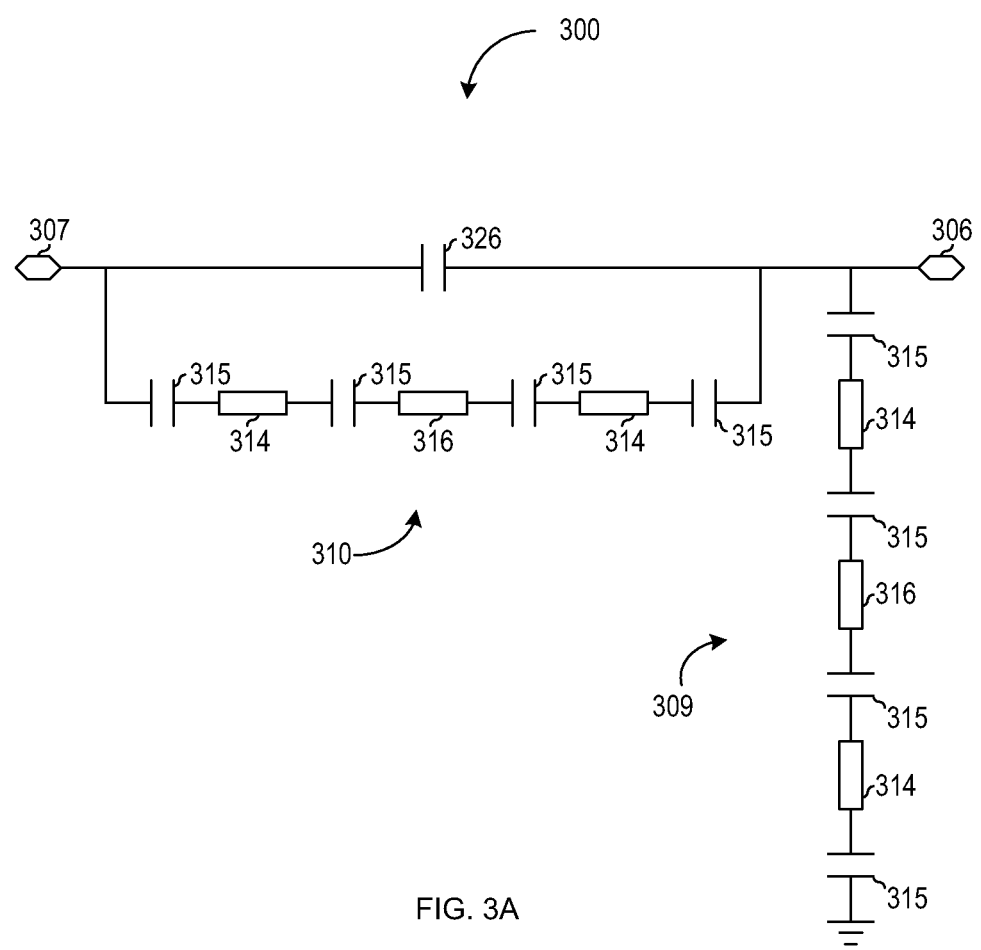
FIG. 3A illustrates generally an equivalent circuit 300 of an example TSV structure of a via layer.

FIG. 3A illustrates generally an equivalent circuit 300 of an example TSV structure of a via layer. In certain examples, the equivalent circuit can include a drive electrode 307, a sense electrode 306, a sense capacitance 326, a first TSV network 310 and a second TSV network 309. The sense capacitance 326 can vary with movements of the device layer. In an example, the first TSV network 310 can represent an isolating trench between the drive electrode 307 and the sense electrode 306. The second TSV network 309 can represent an isolating trench between the sense electrode 306 and a perimeter portion of the via layer. Each network 309, 310 can include four capacitive elements 315 and three resistive elements 314, 316. The capacitive elements 315 can be associated with four vertical dielectric layers discussed above with respect to FIGS. 1 and 2. Two of the three resistive elements 314 can be associated with the two vertical layers of polysilicon. In an example, the third resistive element 316 can be associated with the vertical layer of low resistance monocrystalline silicon. The relatively high resistive vertical layers of polysilicon 314 coupled in series with the shunt capacitance 315 of the dielectric can reduce the shunting effect on the sensor improving the performance of the sense capacitance 326.

Figure 3B:
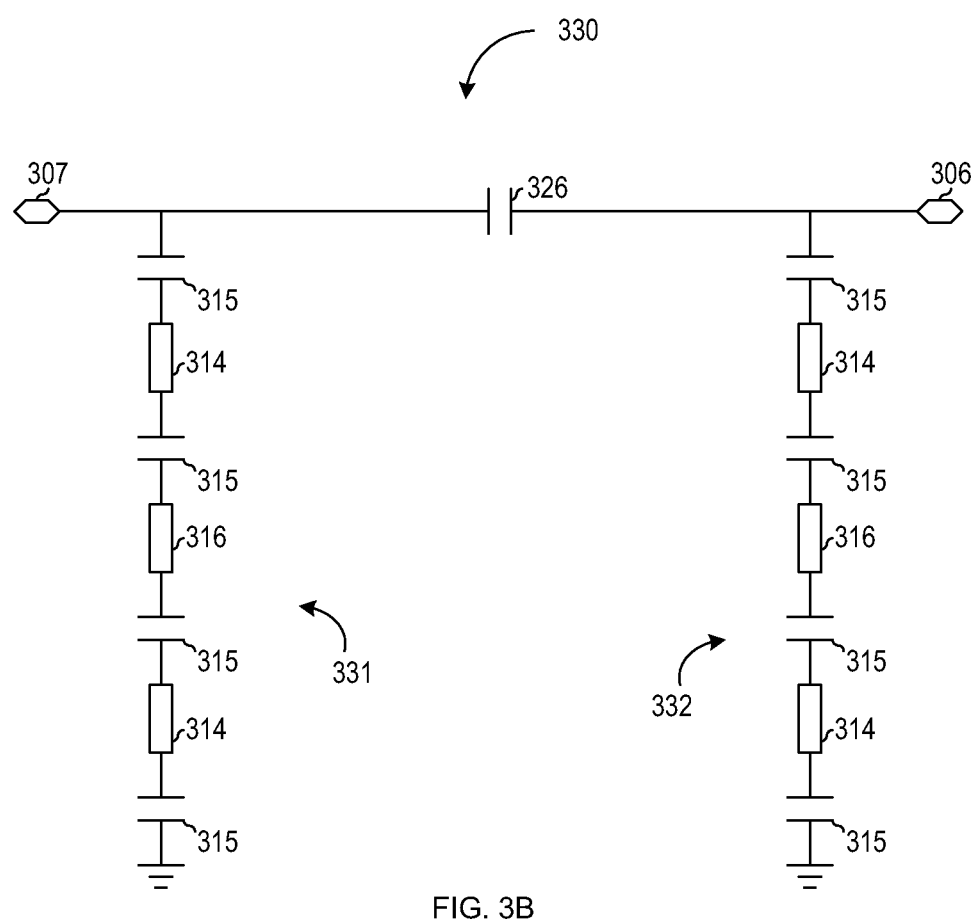
FIG. 3B illustrates generally an alternative layout equivalent circuit of an example TSV structure of a via layer.

FIG. 3B illustrates generally an alternative layout equivalent circuit of an example TSV structure of a via layer. Because the drive voltage is not substantially sensitive to shunt capacitance, for example, due to a low source impedance, degradation of performance of the MEMS sensor can occur due to loading of the sense capacitor output. In examples employing the alternative layout, the equivalent circuit 330 shows the shunt capacitance of the TSV structures 331, 332 loads both sides of the sense capacitance 326.

Additional improvements to reduce shunt capacitance can be achieved by using different combinations and types of polysilicon and dielectric. For example, when a vertical dielectric layer includes two materials such as thermal oxide, with dielectric constant about 3.9 to ensure hermeticity, and low k dielectric, with dielectric constant about 2 to provide structural strength during fabrication, additional shunt capacitance reduction can be achieved. In certain examples, low-k dielectric materials can be porous, thus not capable of maintaining vacuum. Therefore, some low-k dielectrics are not suitable for 100% trench fill. A combination dielectric layer can maintain vacuum and provide benefits associated with a low-k dielectric.

In an example, shunt capacitance reduction, X, can depend on the amount of oxide (O %) and low K dielectric (D %) as a function of the trench length and each dielectric constant, K1 and K2 respectively. For example, $$X=(K2*D+K1*O)/K1$$

If oxide represents 20% of the trench and low k dielectric 80% and K1=3.9, K2=2, then, $$X=(2*0.8+3.9*0.2)/3.9=0.61,$$

representing 39% reduction of shunt capacitance in comparison to a trench filled with oxide only.

If the trench length is 4.0 mm, via layer 200 um, trench area is 0.8 mm$^2$, resulting in oxide capacitance of about 27.6 pF for 1 um thick dielectric. Filling 80% of trench with low k dielectric material can reduce the capacitance to about 16.8 pF.

Partially filing the non-dielectric vertical layers of a trench can also reduce shunt capacitance. In certain examples, if part of the polysilicon fill is removed (etched) during fabrication of the TSV, the shunt capacitance can be further reduced. The reduction impact can be similar to that of using low-k dielectric. The reduction impact can be greater when the polysilican layer is several time thicker than the dielectric layer and the trench is exposed to vacuum which can have a dielectric constant of about 1, which is twice as low as some low-k dielectrics. For the previous example trench, if about 80% of the polythickness is removed, the shunt capacitance can drop from about 27.6 pf to about 6.1 pf.

Figure 4:
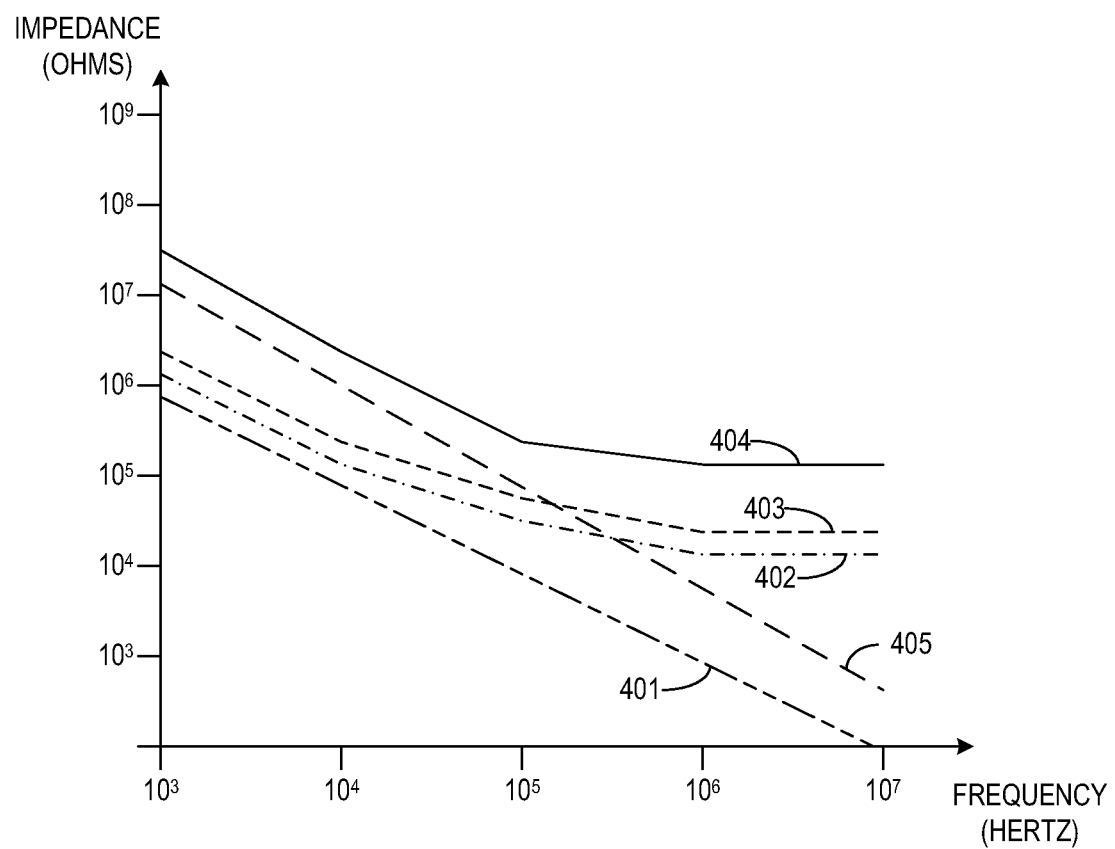
FIG. 4 illustrates generally a comparison of impedance as a function of frequency of various trench structures and a sense capacitance.

FIG. 4 illustrates generally a comparison of impedance as a function of frequency of various trench structures and a 1 pf sense capacitance 405. The various trench structures include, single 401, double 402 and quadruple 403 trench structures with high resistivity poly fill, and a quadruple trench structure 404 employing a low-k dielectric and 80% polysilicon etch back.

Figure 5:
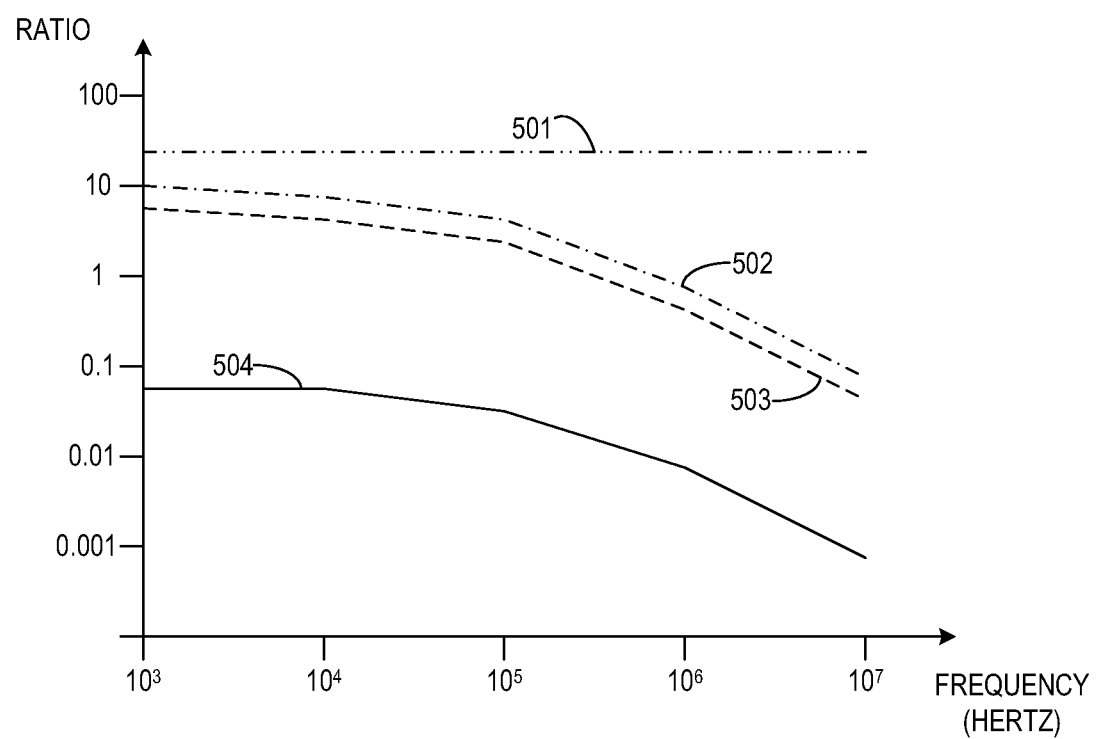
FIG. 5 illustrates generally a comparison of sense capacitor impedance to shunt impedance for four trench configurations as a function of frequency.

Degradation of the signal to noise ratio, thus loss of available performance, can be proportional to the ratio of sense capacitor impedance to shunt impedance. FIG. 5 illustrates generally a comparison of sense capacitor impedance to shunt impedance for four trench configurations as a function of frequency. The four configurations include, single 501, double 502 and quadruple trench structures 503 with high resistivity poly fill, and a quadruple trench structure 504 employing a low-k dielectric and 80% polysilicon etch back. Selecting an operating frequency of electronics where the ratio is lower than 1 enables drastic reduction of shunting impact of TSV capacitance. High resistance poly silicon can provide a low signal to noise ratio at sufficiently low to avoid excessive power consumption. For example, the comparison shows that the single trench structure did not see the ratio of sense capacitor impedance to shunt impedance get below 1 over the illustrated frequency range. In contrast, the quadruple trench structure with low-k dielectric and 20% poly fill had the ratio of sense capacitor impedance to shunt impedance below 1 at DC and below 0.1 at about 639 kHz. In general, the lower the operating frequency of the MEMS device the lower the power consumption, which can be provide significant advantages when using the MEMS device in a mobile system with a limited energy supply source.

ADDITIONAL NOTES AND EXAMPLES

In Example 1, a method includes etching at least a pair of trenches in a first side of a silicon substrate, forming an oxide layer upon the first side of the silicon substrate, forming a polysilicon layer on the oxide layer, etching back the polysilicon layer within each trench of the pair of trenches to a predefined depth, and forming a dielectric layer on the sidewalls of the trenches, the dielectric layer including a portion of the oxide layer and a second dielectric material;

In Example 2, the method of Example 1 optionally includes forming a nitride layer atop the oxide layer.

In Example 3, the forming the nitride layer of any one or more of Examples 1-2 optionally includes removing a portion of the polysilicon layer to the upper surface of the oxide layer at the trench, wherein removing a portion of the polysilicon layer includes leaving a portion of the poly silicon layer within the trenches.

In Example 4, the forming a nitride layer atop the oxide layer of any one or more of Examples 1-3 optionally includes includes forming a resist layer atop the nitride layer.

In Example 5, the method of any one or more of Examples 1-4 optionally includes patterning the resist layer to define boundaries for a recess.

In Example 6, the method of any one or more of Examples 1-5 optionally includes removing a portion of the nitride to further define the boundary of the recess.

In Example 7, the method of any one or more of Examples 1-6 optionally includes etching the recess into the silicon substrate.

In Example 8, the etching the recess of any one or more of Examples 1-7 optionally includes removing a portion of the oxide layer from sidewalls of the trenches.

In Example 9, the forming the oxide layer of any one or more of Examples 1-8 optionally includes forming an oxide layer on sidewalls of the trenches.

In Example 10, the method of any one or more of Examples 1-9 optionally includes bonding a portion of the first side of the silicon substrate to a device layer of a MEMS sensor.

In Example 11, the method of any one or more of Examples 1-10 optionally includes grinding a second side of the silicon substrate to expose a first end of the trenches.

In Example 12, a via layer for a MEMS device can include a substrate having a pair of trenches separated in a horizontal direction by a portion of the substrate, wherein each trench of the pair of trenches includes first and second vertical layers including a first material, the first and second vertical layers separated by a third vertical layer including a second material, wherein the first material includes a dielectric.

In Example 13, the second material of any one or more of Examples 1-12 optionally includes polysilicon.

In Example 14, the third vertical layer of any one or more of Examples 1-13 optionally includes a volume including less than 80% polysilicon.

In Example 15, the third vertical layer of any one or more of Examples 1-14 optionally includes a volume including less than 20% polysilicon.

In Example 16, the first and second vertical layers of any one or more of Examples 1-16 optionally includes thermal oxide.

In Example 17, each of the first and second vertical layers of any one or more of Examples 1-16 optionally includes thermal oxide and a third material having a dielectric constant lower than the dielectric constant of the thermal oxide.

In Example 18, the first material of any one or more of Examples 1-17 optionally includes a thermal oxide and the second material of Example 17 optionally includes a dielectric having a dielectric constant lower than the dielectric constant of the thermal oxide.

In Example 19, a sensor can include a cap layer, a device layer, coupled to the cap layer, including a proof mass, and a via layer coupled to the device layer, wherein the device layer can include a silicon substrate having a pair of trenches separated in a horizontal direction by a portion of the silicon substrate, and wherein each trench of the pair of trenches includes first and second vertical layers including a dielectric separated by a third vertical layer including polysilicon.

In Example 20, the third vertical layer of any one or more of Examples 1-19 optionally includes a volume including less than 80% polysilicon.

In Example 21, the third vertical layer of any one or more of Examples 1-20 optionally includes a volume including less than 20% polysilicon.

In Example 22, the first and second vertical layers of any one or more of Examples 1-21 optionally includes thermal oxide.

In Example 23, each of the first and second vertical layers of any one or more of Examples 1-22 optionally includes thermal oxide and a second material having a dielectric constant lower than the dielectric constant of the thermal oxide.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A via layer for a MEMS device, the via layer comprising;
a substrate having a pair of trenches separated in a horizontal direction by a portion of the substrate, wherein each trench of the pair of trenches includes first and second vertical layers including a dielectric, the first and second vertical layers separated by a third vertical layer including polysilicon, wherein each of the first and second vertical layers include thermal oxide and a third material having a dielectric constant lower than the dielectric constant of the thermal oxide.

2. The via layer of claim 1, wherein less than about 80% of the volume of the third vertical layer includes polysilicon.

3. The via layer of claim 1, wherein less than about 20% of the volume of the third vertical layer includes polysilicon.

4. The via layer of claim 1, wherein the first and second vertical layers include thermal oxide.

5. A sensor comprising:
a cap layer;
a device layer, coupled to the cap layer, including a proof mass; and
a via layer coupled to the device layer, wherein the device layer includes:
a silicon substrate having a pair of trenches separated in a horizontal direction by a portion of the silicon substrate,
wherein each trench of the pair of trenches includes first and second vertical layers including a dielectric separated by a third vertical layer including polysilicon; and
wherein each of the first and second vertical layers include thermal oxide and a second material having a dielectric constant lower than the dielectric constant of the thermal oxide.

6. The sensor of claim 5, wherein less than about 80% of the volume of the third vertical layer includes polysilicon.

7. The sensor of claim 5, wherein less than about 20% of the volume of the third vertical layer includes polysilicon.

8. The sensor of claim 5, wherein the first and second vertical layers include thermal oxide.

* * * * *